US006163245A

United States Patent [19]

Andoh et al.

[11] Patent Number: 6,163,245

[45] Date of Patent: Dec. 19, 2000

[54] NONLINEAR RESISTOR WITH ELECTRODES FORMED BY PLASMA SPRAYING

[75] Inventors: Hideyasu Andoh, Tokyo-To; Yoshiyasu Itoh, Yokohama; Hironori Suzuki, Yokohama; Susumu Nishiwaki, Yokohama, all of Japan

[73] Assignee: Kabushiki Kaisha Toshiba, Kawasaki, Japan

[21] Appl. No.: 09/217,188

[22] Filed: Dec. 22, 1998

[30] Foreign Application Priority Data

Dec. 22, 1997 [JP] Japan .................................. 9-3532253

[51] Int. Cl.[7] ........................................................ H01L 7/13

[52] U.S. Cl. ................................................ 338/21; 338/20

[58] Field of Search ................................. 338/13, 20, 21, 338/327; 427/101, 102; 361/113, 117, 126, 127

[56] References Cited

U.S. PATENT DOCUMENTS

| | | | |
|---|---|---|---|
| 2,796,505 | 6/1957 | Bocciarelli | 338/20 |
| 3,496,512 | 2/1970 | Matsuoka | 338/20 |
| 3,872,419 | 3/1975 | Groves et al. | 338/21 |
| 4,451,815 | 5/1984 | Sakshaug et al. | 338/21 |
| 4,452,728 | 6/1984 | Carlson et al. | 252/518 |
| 4,736,183 | 4/1988 | Yamazaki et al. | 338/20 |
| 4,835,508 | 5/1989 | Seike et al. | 338/21 |
| 4,853,670 | 8/1989 | Stengard | 338/21 |
| 4,959,632 | 9/1990 | Uchida | 338/22 R |
| 5,509,558 | 4/1996 | Imai et al. | 218/143 |
| 5,874,885 | 2/1999 | Chandler et al. | 338/22 R |

FOREIGN PATENT DOCUMENTS

| | | | |
|---|---|---|---|
| 3-125401 | 5/1991 | Japan . | |
| 5275209 | 10/1993 | Japan | 338/21 |
| 7-44087 | 5/1995 | Japan . | |

OTHER PUBLICATIONS

Patent Abstracts of Japan, vol. 14, No. 229 (E–0928), May 15, 1990, & JP 02 058807 (Matsushita Electric Ind. Co., Ltd.) Feb. 28, 1990 (Abstract).

Database WPI Week 862830 May 1986, Derwent Pub. Ltd., London, GB; XP002097822 & JP 61 112301 (Matsushita), May 30, 1986 (Abstract).

Database WPI, Week 8230, Derwent Pub. Ltd., London, GB; XP002097823 & JP 57 099708, Jun. 21, 1982 (Abstract).

*Primary Examiner*—Karl D. Easthom
*Attorney, Agent, or Firm*—Foley & Lardner

[57] ABSTRACT

A nonlinear resistor is formed by forming side surface insulating layer 2 on a sintered body 1 which contains zinc oxide as a main component and providing a pair of electrodes 3 on upper and lower surfaces of the sintered body 1. The electrodes 3 are formed by plasma thermal spraying of less than 10 kW in an atmosphere in which an oxygen concentration is set to 22 volume % or less. The electrodes 3 are formed of aluminum, copper, zinc, nickel, silver, or their alloy whose average particle size is within 5 μm to 50 μm. Preferably porosity is less than 15%, weight percentage of metal oxide is less than 25%, average film thickness is within 5 μm to 500 μm, average surface roughness is less than 8 μm, and resistivity is less than 15 μΩ·cm. Accordingly, the nonlinear resistor having the excellent discharge withstand can be provided.

10 Claims, 5 Drawing Sheets

NONLINEAR RESISTOR WITH ELECTRODES FORMED BY PLASMA SPRAYING

BACKGROUND OF THE INVENTION

1. Field of the Invention

The present invention relates to a nonlinear resistor employed in an arrester, a surge absorber, etc., i.e., a nonlinear resistor which includes zinc oxide as a main component and has a nonlinear resistance characteristic, and a method of manufacturing the nonlinear resistor.

2. Description of the Related Art

In general, an overvoltage protection instrument such as an arrester, a surge absorber, etc. has been employed in the power system, and a nonlinear resistor has been frequently employed in such overvoltage protection instrument. In particular the "nonlinear resistor" has a nonlinear resistance characteristic which exhibits an insulating characteristic at the normal voltage but exhibits a low resistance value when an overvoltage is applied to the nonlinear resistor. Thus, the overvoltage being superposed on the normal voltage can be removed by such nonlinear resistor. Therefore, the nonlinear resistor is extremely effective for the protection of the power system and the electrical machinery and apparatus. Such nonlinear resistor has a sintered body. The sintered body includes zinc oxide as a main component. The zinc oxide is mixed, granulated, formed, and sintered while adding at least one type metal oxide as an additive to achieve the nonlinear resistance characteristic. Insulating layers are also formed on side surfaces of each sintered body, and electrodes formed of aluminum, etc. are formed on an upper surface and a lower surface of the sintered body by an arc thermal spraying, etc.

Discharge energy withstand is set to the above-mentioned nonlinear resistor. Then, the nonlinear resistor is brought into breakdown mechanically or electrically if the discharge energy being applied to the nonlinear resistor exceeds this discharge energy withstand. As one of breakdown types of the nonlinear resistor caused when such nonlinear resistor absorbs the discharge energy, there is breakdown which is due to an electrode layer of the nonlinear resistor. More particularly, the nonlinear resistor comes to breakdown in the following cases. That is, there are cases where, (1) if the nonlinear resistors are stacked, discharge is generated in voids between the stacked electrode layers since a surface of the electrode layer is not flat, whereby the nonlinear resistor comes to breakdown, (2) if the voids are formed in the electrode layers, discharge is generated in the voids, whereby the nonlinear resistor comes to breakdown, and (3) partial current concentration is caused in the nonlinear resistor to bring the nonlinear resistor into breakdown, because of shape of end portions of the electrode and voids formed in the electrode layers.

Under above situations, various techniques for improving a discharge energy withstand characteristic of the nonlinear resistor have been developed and proposed. For example, the technique for employing aluminum containing any of Mg, Ca, and Ti as electrode material has been disclosed in Patent Application Publication (KOKOKU) Hei 7-44087 filed by the applicant of the present invention. In addition, the technique for suppressing difference between a maximum value and a minimum value of a distance between an electrode end portion and a sintered body external peripheral edge, i.e., an eccentricity of a circular disk type electrode against the sintered body containing an insulating layer, to less than 1 mm has been disclosed in Patent Application Publication (KOKAI) Hei 3-125401.

In recent years, power demand has been increased greatly and a transmission system voltage has increased steadily correspondingly. If the transmission system voltage is increased, the discharge energy being applied to the nonlinear resistor cannot help increasing. Hence, it is requested for the nonlinear resistor to have very high discharge energy withstand.

SUMMARY OF THE INVENTION

The present invention has been made to overcome the problems as described above in the related art, and it is an object of the present invention to provide a nonlinear resistor which is able to prevent its breakdown due to an electrode of the nonlinear resistor in receiving a discharge energy by restricting electrode forming conditions and material or shape of the electrode, to have an extremely excellent discharge energy withstand characteristic.

In order to achieve the above object, according to a first aspect of the present invention, a nonlinear resistor comprises a sintered body including a zinc oxide as a main component, said sintered body having an upper surface, a lower surface, and a side surface; a insulating layer formed on the side surface of the sintered body; and a pair of electrodes formed on the upper surface and the lower surface of the sintered body respectively by a plasma thermal spraying.

According to the nonlinear resistor of the present invention constructed as above, unevenness of the current distribution in the sintered body while absorbing the discharge energy can be prevented by optimizing the conditions of the plasma thermal spraying to form the electrodes, so that the high discharge energy withstand can be achieved.

Preferably, in the nonlinear resistor according to the present invention, the electrode is formed by the plasma thermal spraying in an atmosphere in which an oxygen concentration is set to less than or equal to 22 volume %.

In such nonlinear resistor, since the oxygen concentration is suppressed lower than or equal to 22 volume % in the atmosphere for the plasma thermal spraying to form the electrode, an amount of oxide in the thermal spraying electrode can be suppressed small, planalization of the surface of the electrode can be advanced, and voids in the electrode can be reduced. For this reason, unevenness of current distribution in the sintered body while absorbing the discharge energy can be prevented and thus discharge energy withstand can be achieved.

Preferably, in the nonlinear resistor according to the present invention, the electrode is formed by the plasma thermal spraying of which an output is set to less than or equal to 10 kW.

In such nonlinear resistor, since the electrode is formed by the plasma thermal spraying of low output such as 10 kW or less, the electrode of a predetermined shape can be easily obtained. In addition, since residual stress of the thermal spraying electrode film can be suppressed, an adhesion force between the electrode and the sintered body can be enhanced to prevent peel between them, and the high discharge energy withstand can be attained.

Preferably, in the nonlinear resistor according to the present invention, the electrode is formed of any one of aluminum, copper, zinc, nickel, and silver or their alloy.

In such nonlinear resistor, since any one of aluminum, copper, zinc, nickel, and silver or their alloy is employed as material of the electrode, the conductivity of the electrode and the adhesion force between the electrode and the sintered body can be enhanced, so that the excellent discharge energy withstand can be achieved.

Preferably, in the nonlinear resistor according to the present invention, the electrode is formed by a metal powder, and an average particle size of the metal powder is set in a range of 5 μm to 50 μm.

In such nonlinear resistor having the above structure, powder evaporation in plasma thermal spraying can be prevented by setting the average particle size of the metal powders of the electrodes to more than or equal to 5 μm. Therefore, unevenness of the current distribution in the sintered body due to lack in film thickness caused by the evaporation can be prevented. In addition, an amount of unmelted particles during the plasma thermal spraying can be reduced by setting the average particle size of the metal powders of the electrodes to less than or equal to 5 μm. Accordingly, the voids in the electrode can be reduced by suppressing an amount of unmelted particles stuck onto the sintered body, so that the high discharge energy withstand can be achieved.

Preferably, in the nonlinear resistor according to the present invention, the upper surface and the lower surface of the sintered body have an average surface roughness within a range of 3 μm to 8 μm.

In such nonlinear resistor having the above structure, since the average surface roughness of the surface of the sintered body in forming the electrode is set larger than or equal to 3 μm, the surface area of the sintered body to sufficiently ensure the adhesion force between the sintered body and the electrode can be obtained. In addition, since the average surface roughness of the surface of the sintered body in forming the electrode is suppressed smaller than or equal to 8 μm, unevenness of the current distribution at the convex top end of the sintered body can be prevented. Accordingly, the discharge energy withstand of the nonlinear resistor can be enhanced.

Preferably, in the nonlinear resistor according to the present invention, the electrode has a porosity of less than or equal to 15%.

In such nonlinear resistor having the above structure, since the porosity of the electrodes is set to less than or equal to 15%, generation of the discharge in the voids can be prevented by reducing the voids in the electrode, and at the same time unevenness of the current distribution due to clearances on the interface between the sintered body and the electrode can be prevented. Accordingly, the discharge energy withstand of the nonlinear resistor can be enhanced.

Preferably, in the nonlinear resistor according to the present invention, the electrode contains a metal oxide and a metal, and a weight percentage of the metal oxide contained in the electrode is set to less than or equal to 25%.

In such nonlinear resistor having the above structure, since the weight percentage of the metal oxide contained in the electrode is suppressed smaller than or equal to 25%, the voids in the electrode can be reduced. Accordingly, the discharge due to the voids in the electrode can be prevented, so that the high discharge energy withstand of the nonlinear resistor can be attained.

Preferably, in the nonlinear resistor according to the present invention, the electrode has an average thickness in a range of 5 μm to 500 μm.

In such nonlinear resistor having the above structure, since the average thickness of the electrode is set in the range of 5 μm to 500 μm, lack in film thickness and adhesion defect of the electrode can be prevented, and also peel of the sintered body and the electrode because of increase in residual stress in the electrodes can be prevented. Accordingly, unevenness of the current distribution in the sintered body due to such lack in film thickness, adhesion defect, peel, etc. can be prevented, so that the high discharge energy withstand of the nonlinear resistor can be attained.

Preferably, in the nonlinear resistor according to the present invention, the electrode has an average surface roughness of less than or equal to 8 μm.

In such nonlinear resistor having the above structure, since the average surface roughness of the electrode is suppressed smaller than or equal to 8 μm, the clearance between the stacked nonlinear resistors can be reduced. Accordingly, generation of the discharge between the electrode can be prevented when the discharge energy is applied, so that the high discharge energy withstand of the nonlinear resistor can be attained.

Preferably, in the nonlinear resistor according to the present invention, the electrode has a resistivity of less than or equal to 15 μΩ·cm.

In such nonlinear resistor having the above structure, since the resistivity of the electrode is set to less than or equal to 15 μΩ·cm, no high resistance area is formed on the interface between the sintered body and the electrode. Accordingly, unevenness of the current distribution in the nonlinear resistor can be prevented, so that the high discharge energy withstand of the nonlinear resistor can be attained.

Preferably, in the nonlinear resistor according to the present invention, the electrode has a side end portion and the sintered body has a side end portion, and a distance between the side end portion of the electrode and the side end portion of the sintered body is set in a range of 0.01 mm to 1.0 mm.

In such nonlinear resistor having the above structure, since the distance between the side end portion of the electrode and the side end portion of the sintered body is limited from 0.01 mm to 1.0 mm, i.e., electrode forming range is limited, generation of the discharge between the electrodes as well as unevenness of the current distribution in the nonlinear resistor can be prevented. Accordingly, local unevenness of the current distribution in the sintered body while absorbing the discharge energy can be prevented, so that the high discharge energy withstand of the nonlinear resistor can be attained.

Preferably, in the nonlinear resistor according to the present invention, the electrode has a side end portion which has an unevenness in a direction parallel with the upper surface or the lower surface of the sintered body, a variation of the unevenness is set in a range of ±0.5 mm.

In such nonlinear resistor having the above structure, since the unevenness of the electrode along the main surface is limited within a range of ±0.5 mm, local unevenness of the current distribution in the sintered body while absorbing the discharge energy can be prevented, so that the high discharge energy withstand of the nonlinear resistor can be attained.

According to a second aspect of the present invention, a method of manufacturing a nonlinear resistor comprises the steps of: (a) forming a sintered body by sintering a material including a zinc oxide as a main component, said sintered body having an upper surface, a lower surface, and a side surface; (b) forming an insulating layer on the side surface of the sintered body; and (c) forming a pair of electrodes on the upper surface and the lower surface of the sintered body respectively by a plasma spraying.

Preferably, in the method of manufacturing a nonlinear resistor according to the present invention, the plasma spraying is performed in an atmosphere in which an oxygen concentration is set to less than or equal to 22 volume %.

Preferably, in the method of manufacturing a nonlinear resistor according to the present invention, an output of the plasma spraying is set to less than or equal to 10 kW.

Preferably, in the method of manufacturing a nonlinear resistor according to the present invention, the electrode is formed of any one of aluminum, copper, zinc, nickel, and silver or their alloy.

Preferably, in the method of manufacturing a nonlinear resistor according to the present invention, the electrode is formed by a metal powder, and an average particle size of the metal powder is set in a range of 5 $\mu$m to 50 $\mu$m.

Preferably, in the method of manufacturing a nonlinear resistor according to the present invention, the upper surface and the lower surface of the sintered body have an average surface roughness within a range of 3 $\mu$m to 8 $\mu$m.

Preferably, in the method of manufacturing a nonlinear resistor according to the present invention, the electrode has a porosity of less than or equal to 15%.

Preferably, in the method of manufacturing a nonlinear resistor according to the present invention, the electrode contains a metal oxide and a metal, and a weight percentage of the metal oxide contained in the electrode is set to less than or equal to 25%.

Preferably, in the method of manufacturing a nonlinear resistor according to the present invention, the electrode has an average thickness in a range of 5 $\mu$m to 500 $\mu$m.

Preferably, in the method of manufacturing a nonlinear resistor according to the present invention, the electrode has an average surface roughness of less than or equal to 8 $\mu$m.

Preferably, in the method of manufacturing a nonlinear resistor according to the present invention, the electrode has a resistivity of less than or equal to 15 $\mu\Omega\cdot$cm.

Preferably, in the method of manufacturing a nonlinear resistor according to the present invention, the electrode has a side end portion and the sintered body has a side end portion, and a distance between the side end portion of the electrode and the side end portion of the sintered body is set in a range of 0.01 mm to 1.0 mm.

Preferably, in the method of manufacturing a nonlinear resistor according to the present invention, the electrode has a side end portion which has an unevenness in a direction parallel with the upper surface or the lower surface of the sintered body, a variation of the unevenness is set in a range of ±0.5 mm.

Figure 5:
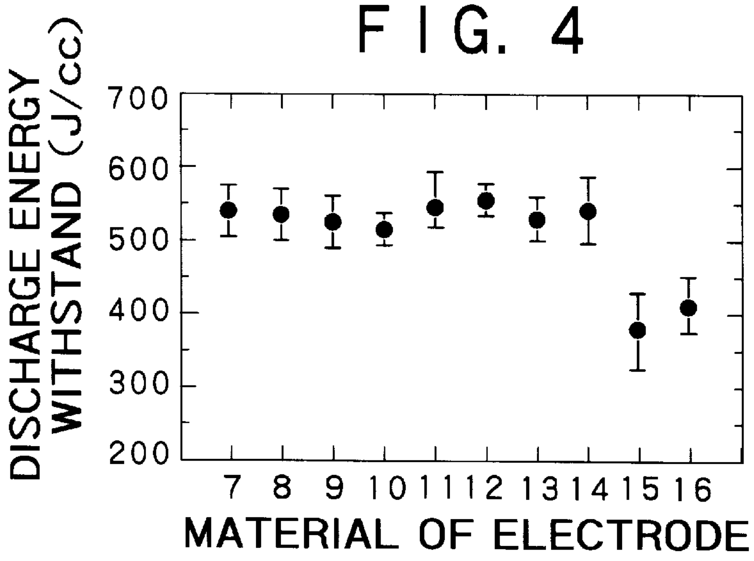
Figure 6:
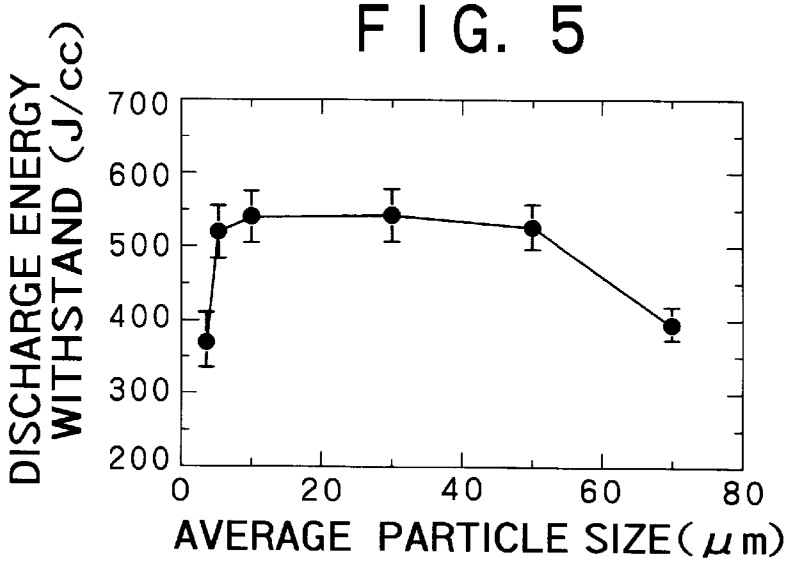
Figure 7:
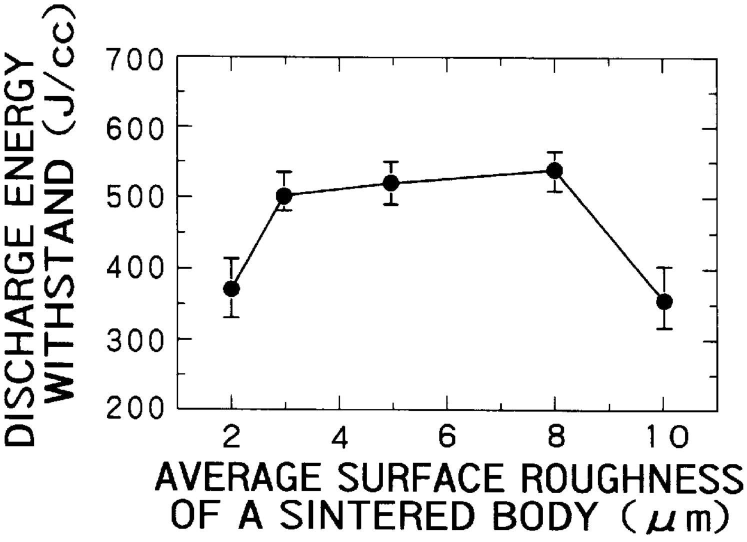
Figure 8:
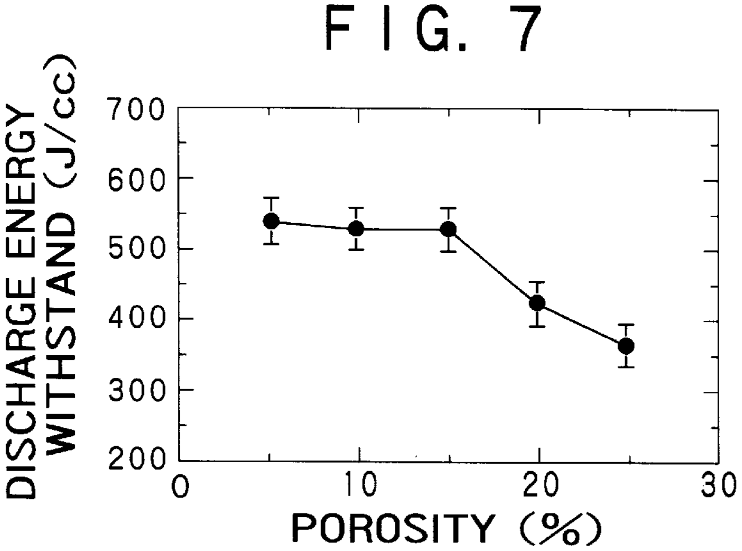
Figure 9:
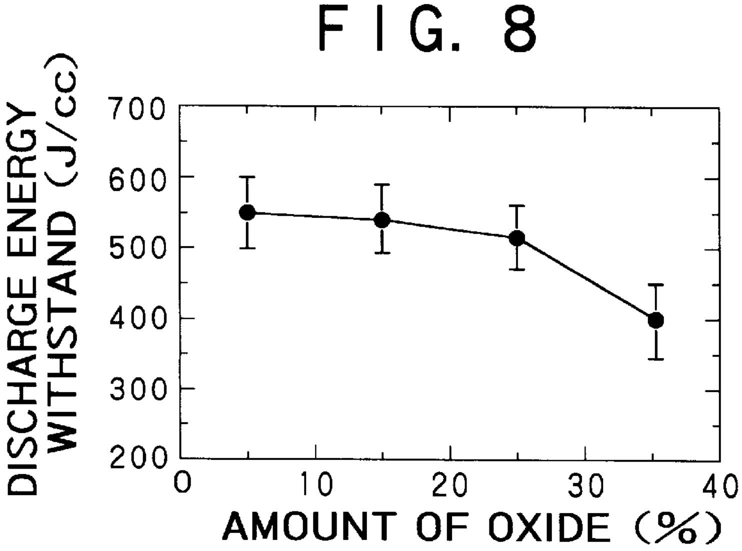
Figure 10:
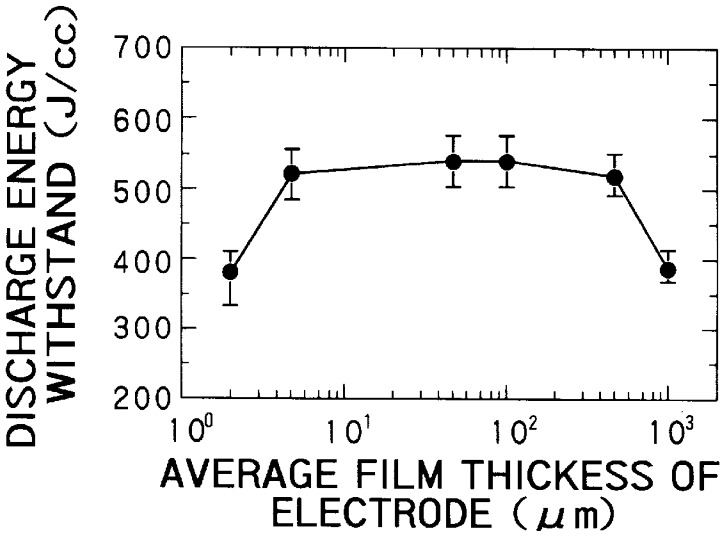
Figure 11:
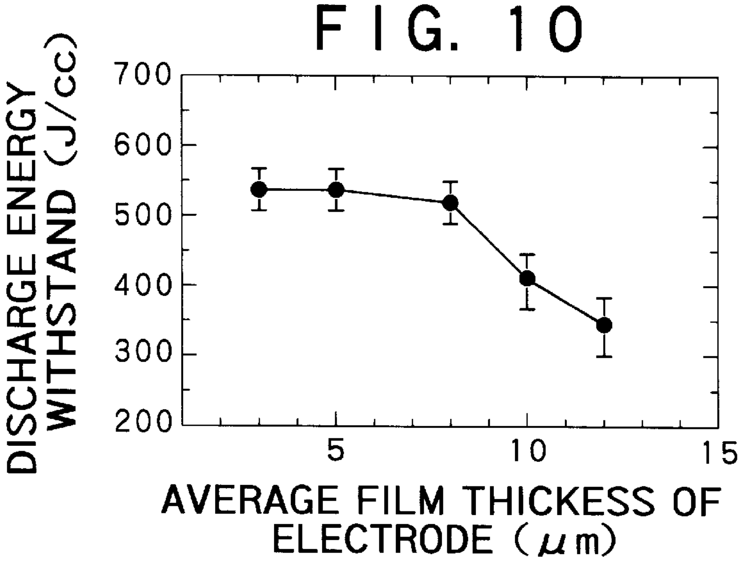
Figure 12:
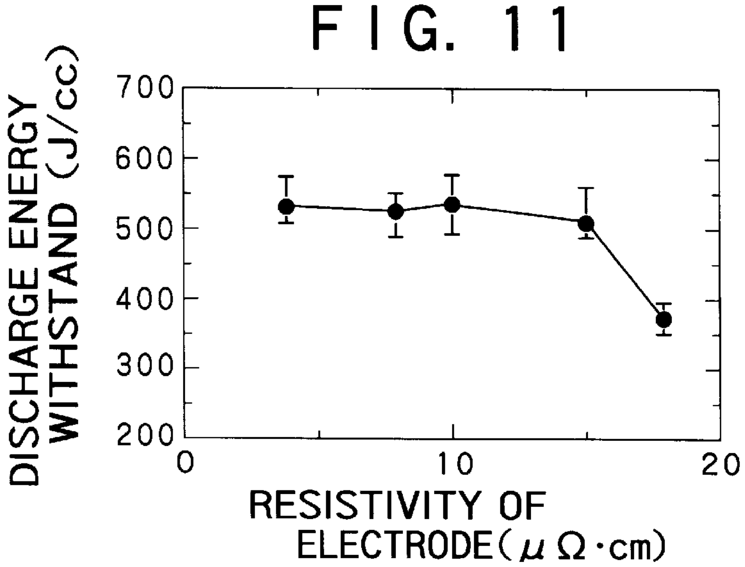
Figure 13:
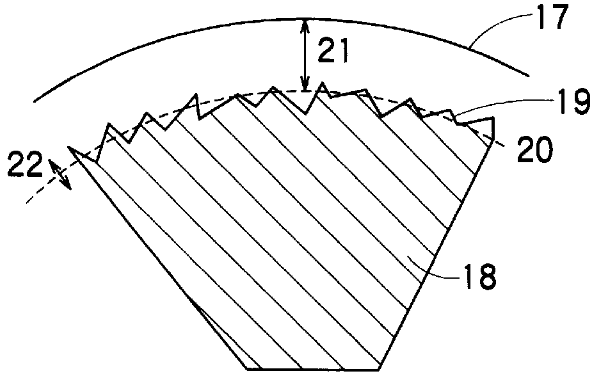
Figure 14:
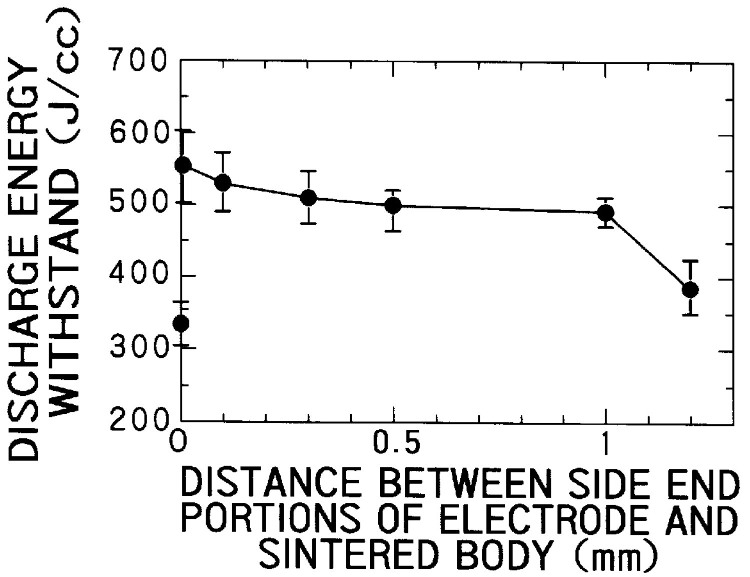
Figure 15:
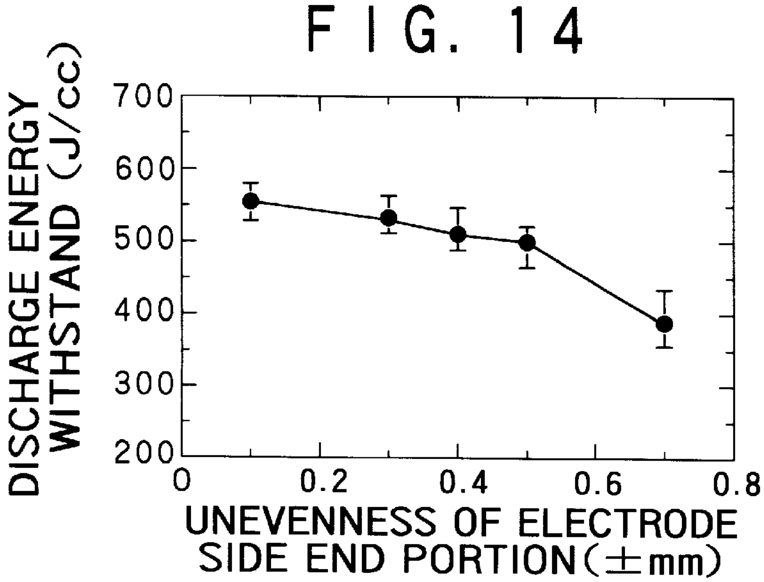

PIG. 4 is a graph showing a relationship between a thermal spraying output and discharge energy withstand when the electrode of the nonlinear resistor according to a second embodiment of the present invention is formed;

FIG. 5 is a graph showing a relationship between material of the electrode of the nonlinear resistor according to the second embodiment of the present invention and discharge energy withstand;

FIG. 6 is a graph showing a relationship between an average particle size of a thermal spraying powder and discharge energy withstand when the electrode of the nonlinear resistor according to the second embodiment of the present invention is formed;

FIG. 7 is a graph showing a relationship between average surface roughness of a sintered body and discharge energy withstand when the electrode of the nonlinear resistor according to the second embodiment of the present invention is formed;

FIG. 8 is a graph showing a relationship between a porosity of the electrode of the nonlinear resistor according to a third embodiment of the present invention and discharge energy withstand;

FIG. 9 is a graph showing a relationship between an amount of oxide in the electrode of the nonlinear resistor according to the third embodiment of the present invention and discharge energy withstand;

FIG. 10 is a graph showing a relationship between an average film thickness of the electrode of the nonlinear resistor according to the third embodiment of the present invention and discharge energy withstand;

FIG. 11 is a graph showing a relationship between average surface roughness of the electrode of the nonlinear resistor according to the third embodiment of the present invention and discharge energy withstand;

FIG. 12 is a graph showing a relationship between a resistivity of the electrode of the nonlinear resistor according to the third embodiment of the present invention and discharge energy withstand;

FIG. 13 is a schematic view showing an electrode side end portion of the nonlinear resistor according to a fourth embodiment of the present invention and discharge energy withstand in an enlarged manner;

FIG. 14 is a graph showing a relationship between a distance between the electrode side end portion of the nonlinear resistor according to the fourth embodiment of the present invention and an end portion of the sintered body and discharge energy withstand; and FIG. 15 is a graph showing a relationship between unevenness of an end portion of the electrode of the nonlinear resistor according to the fourth embodiment of the present invention and discharge energy withstand.

DETAILED DESCRIPTION OF THE PREFERRED EMBODIMENTS

Various embodiments to which a nonlinear resistor according to the present invention is applied will be explained in detail with reference to the accompanying drawings hereinafter.

(1) First embodiment

A nonlinear resistor according to a first embodiment of the present invention will be explained with reference to FIGS. 1 to 3 hereinbelow.

Figure 1:
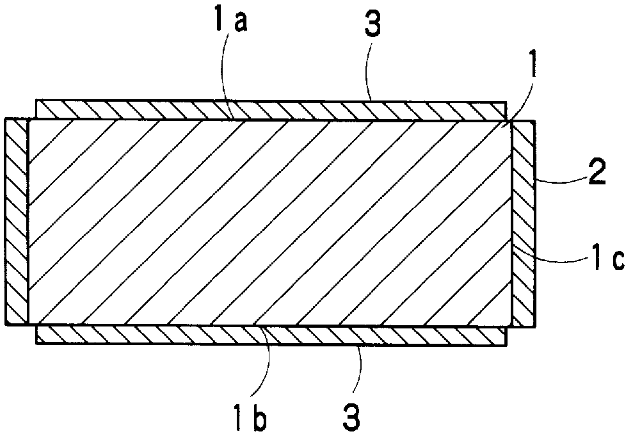
FIG. 1 is a sectional view showing a nonlinear resistor according to a first embodiment of the present invention.

FIG. 1 is a sectional view showing the nonlinear resistor according to the first embodiment. As shown in FIG. 1, this nonlinear resistor has a sintered body 1 which is formed to include zinc oxide as a main component. This sintered body 1 has an upper surface 1*a*, a lower surface 1*b*, and a side surface 1*c*. An insulating layer is formed on the side surface 1*c* of the sintered body 1, and a pair of electrodes 3 are respectively formed on the upper surface 1*a* and the lower surface 1*b* of the sintered body 1.

The electrodes 3 are formed by plasma thermal spraying. This plasma thermal spraying is carried out in an atmosphere in which an oxygen concentration is set to less than or equal to 22 volume %.

Next, a method of manufacturing the nonlinear resistor according to the first embodiment will be explained hereinbelow.

To begin with, material of the nonlinear resistor is prepared by adding manganese dioxide (MnO2), cobalt oxide (Co2O3), bismuth oxide (Bi2O3), antimony oxide (Sb2O3), and nickel oxide (NiO) as metal oxides to zinc oxide (ZnO) as a main component.

Then, such material as well as water, organic dispersing agent, and binders are put into a mixer and then mixed. Then, such mixture is sprayed by a spray dryer to granulate. Then, such granulated powders are filled in a mould to be pressed, so that a circular plate which has a diameter of 100 mm and a thickness of 30 mm is formed. Then, a pressed body is burned at 1200° C. to get the sintered body 1 (see FIG. 1).

Subsequently, alumina group inorganic insulator is coated on the side surface 1c of the sintered body 1, and then side surface insulating film 2 is formed on the side surface 1*c* by baling the inorganic insulator at 400° C. Then, main upper and lower surfaces 1*a*, 1*b* of the sintered body 1 which has the side surface insulating film 2, are polished respectively, and then a guard mask is covered on the sintered body 1. Then, the electrodes 3 are formed on polished upper and lower surfaces by the plasma thermal spraying. As above, the nonlinear resistor can be fabricated.

Then, a discharge energy withstand test which is applied to the nonlinear resistor according to the first embodiment will be explained hereunder.

[Discharge energy withstand test]

A sample is prepared by stacking three sheets of nonlinear resistors which are fabricated under the same conditions. Then, while increasing a discharge energy amount from 200 J/cc to 20 J/cc, rectangular discharge energy of 2 ms has been applied to respective samples at a five minute interval. Thus, a destructive test is conducted until at least one sheet of three nonlinear resistors is destroyed electrically. At this time, a maximum value of the discharge energy amount being absorbed to cause the destination of the sample is assumed as discharge energy withstand (J/cc). As with respective electrode forming conditions or electrode shape of the nonlinear resistor, the discharge energy withstand test is applied to ten sets of nonlinear resistors.

(1-1) Thermal spraying method

Figure 2:
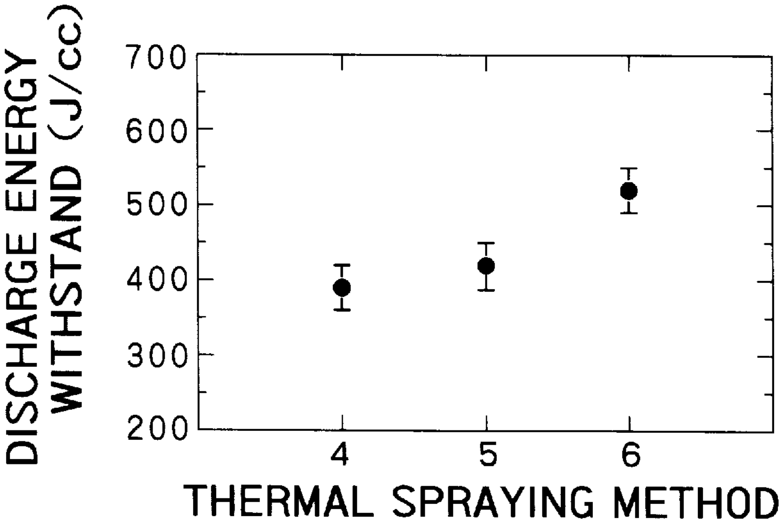
FIG. 2 is a graph showing a relationship between a thermal spraying method and discharge energy withstand when an electrode of the nonlinear resistor according to the first embodiment of the present invention is formed.

FIG. 2 is a graph showing the result of the discharge energy withstand test of the nonlinear resistor according to the first embodiment when the thermal spraying method of forming the electrode of the nonlinear resistor is changed. In FIG. 2, a reference 4 denotes a nonlinear resistor having electrodes which are formed by the non-vacuum arc thermal spraying; 5, nonlinear resistor having electrodes which are formed by the non-vacuum high-speed gas flame thermal spraying; and 6, nonlinear resistor having electrodes which are formed by the non-vacuum plasma thermal spraying.

As can be seen from FIG. 2, if the electrodes 3 of the nonlinear resistor 6 is formed by the non-vacuum plasma thermal spraying, the discharge energy withstand of the nonlinear resistor is clearly enhanced rather than the case where the electrodes 3 of the nonlinear resistor 4 is formed by the non-vacuum arc thermal spraying or the case where the electrodes 3 of the nonlinear resistor 5 is formed by the non-vacuum high-speed gas flame thermal spraying.

More particularly, if the electrodes are formed by the arc thermal spraying, thermal spraying particles being melted and sprayed onto the electrodes are large, and thus a surface of the electrode is not smooth and a number of pores and oxides are contained in the electrode. Hence, the nonlinear resistor having excellent discharge energy withstand has not been able to be implemented. In addition, if the electrodes are formed by the high-speed gas flame thermal spraying, a spraying pressure in spraying is high, and thus a guard mask of the electrodes is easily deformed in spraying. Hence, the electrode cannot be formed into a predetermined shape. As a result, the nonlinear resistor having excellent discharge energy withstand has not been available.

In contrast, the nonlinear resistor according to the first embodiment, in which the electrodes 3 are formed by the plasma thermal spraying, exhibits a remarkably excellent discharge energy withstand characteristic. This is because the electrode 3 being formed by the plasma thermal spraying has a smooth surface, and the pores and the oxides are less contained in the electrodes 3, and the electrode 3 can be formed to have a predetermined shape. The nonlinear resistor having such electrodes 3 can have the excellent discharge energy withstand.

(1-2) Oxygen concentration in thermal spraying atmosphere

Figure 3:
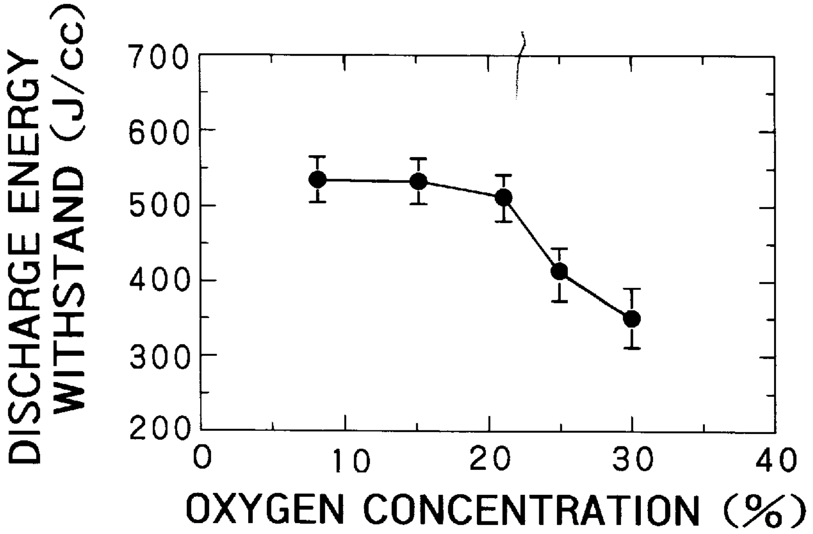
FIG. 3 is a graph showing a relationship between an oxygen concentration in an atmosphere and discharge energy withstand when the electrode of the nonlinear resistor according to the first embodiment of the present invention is formed.

FIG. 3 is a graph showing the result of the discharge energy withstand test of the nonlinear resistor whose electrodes 3 are formed by using the plasma thermal spraying, while changing an oxygen concentration in a thermal spraying atmosphere, when the electrodes 3 of the nonlinear resistor according to the first embodiment of the present invention is formed. As evident from FIG.3, when the electrodes 3 are formed in the atmosphere in which the oxygen concentration is set to less than or equal to 22 volume %, the nonlinear resistor shows the remarkably excellent discharge energy withstand since an amount of oxide in the thermal spraying electrode is small.

As described above, according to the first embodiment wherein the electrodes 3 of the nonlinear resistor is formed by using the plasma thermal spraying in the atmosphere which contains the oxygen concentration of less than or equal to 22 volume %, planalization of the surface of the electrodes 3 can be advanced by suppressing an amount of oxide in the thermal spraying electrode smaller to thus reduce voids in the electrodes 3. For this reason, unevenness of current distribution in the sintered body 1 while absorbing the discharge energy can be prevented and thus the nonlinear resistor can have excellent discharge energy withstand.

(2) Second embodiment

Next, a second embodiment of the present invention will be explained with reference to FIGS. 4 to 7 hereunder. First, several types of the nonlinear resistors are fabricated. Such nonlinear resistors have the electrodes 3 which are formed under different electrode forming conditions, but satisfying at least the condition for the electrodes 3 in the first embodiment, i.e., "the electrodes 3 are formed by the plasma thermal spraying in the atmosphere in which the oxygen" concentration is set to less than or equal to 22 volume %" in the nonlinear resistor manufacturing steps set forth in the first embodiment.

More particularly, several types of the nonlinear resistors are fabricated under plural electrode forming conditions such as (2-1) thermal spraying output, (2-2) material of electrode, (2-3) average particle size of thermal spraying powder employed in forming the electrodes, and (2-4) surface roughness of a sintered body 1 on which the electrodes are formed. Then, while changing each objective condition as a parameter, the discharge energy withstand test is applied to several types of the nonlinear resistors respectively under the same discharge energy withstand test conditions as the above first embodiment. Plural electrode forming conditions being set actually to respective withstand conditions, and results of the discharge energy withstand test of several types of the nonlinear resistors which have the electrodes 3 formed under the plural electrode forming conditions will be explained separately in the following.

(2-1) Thermal spraying output

Figure 4:
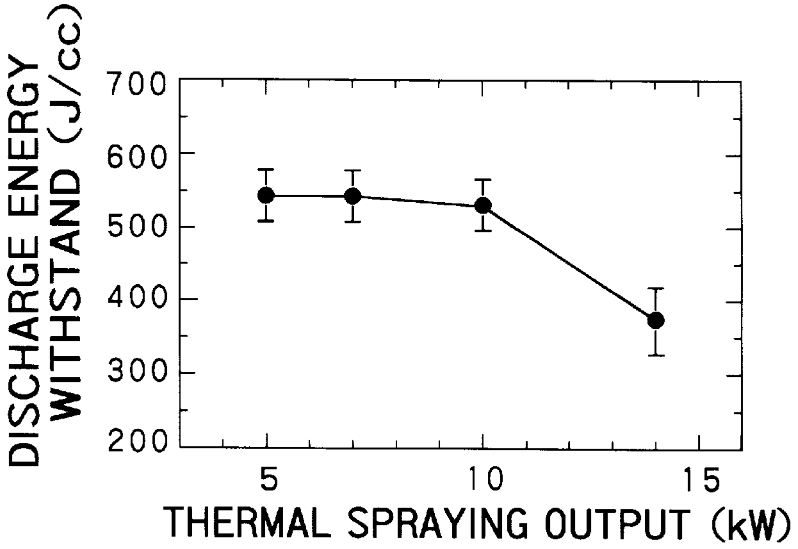

FIG. 4 is a graph showing a relationship between the thermal spraying output (kW) and the discharge energy withstand (J/cc). As evident from the results of the test shown in FIG. 4, the nonlinear resistor whose electrodes 3 are formed at the thermal spraying output below or equal to 10 kW shows on an average the high discharge energy withstand in excess of 500 J/cc, whereas the nonlinear resistor whose electrodes 3 are formed at the thermal spraying output of more than 10 kW shows the low discharge energy withstand.

In other words, in the nonlinear resistor in which the electrodes 3 are formed by using the high thermal spraying output in excess of 10 kW, the thermal spraying output is high and thus the electrode 3 having the predetermined shape is difficult to be formed. In addition, since the thermal spraying speed is high at the high output in excess of 10 kW, residual stress of the thermal spraying electrode film becomes high. As a result, end portions of the electrodes 3 which are subjected to the thermal spraying are ready to peel. On the contrary, in the nonlinear resistor in which the electrodes 3 are formed by using the low thermal spraying output below or equal to 10 kW, the electrodes 3 having the predetermined shape can be easily formed and residual stress of the thermal spraying electrode film becomes low. As a result, the thermal-sprayed electrode having high adhesiveness can be formed and also the nonlinear resistor can have the excellent discharge energy withstand.

(2-2) Material of electrode

FIG. 5 is a graph showing a relationship between material of the electrode 3 of the nonlinear resistor according to the second embodiment and the discharge energy withstand (J/cc). More specifically, FIG. 5 shows results of the discharge energy withstand test of the nonlinear resistor in which powder material is varied when the electrodes 3 of the nonlinear resistor are formed by using the plasma thermal spraying. FIG. 5 shows the discharge energy withstand of the nonlinear resistors which employ material such as aluminum 7, copper 8, zinc 9, nickel 10, silver 11, alloy of copper and zinc 12, alloy of nickel and aluminum 13, alloy of silver and copper 14, carbon steel 15, and 13% Cr stainless steel 16, as the material of the electrodes 3, respectively.

As evident from FIG.5, the nonlinear resistors in which the material of the electrodes 3 is formed of aluminum 7, copper 8, zinc 9, nickel 10, silver 11, alloy of copper and zinc 12, alloy of nickel and aluminum 13, or alloy of silver and copper 14 show on an average the excellent discharge energy withstand in excess of 500 J/cc, nevertheless the discharge energy withstand is low in the nonlinear resistors in which the material of the electrodes 3 is formed of carbon steel 15 or 13% Cr stainless steel 16. In other words, in the nonlinear resistor in which the electrodes 3 are formed by using the carbon steel 15 or the 13% Cr stainless steel 16 as the material of the electrode 3, a conductivity of the electrode 3 is low and also adhesiveness between the sintered body 1 and the electrodes 3 is small. Therefore, the discharge energy withstand of the nonlinear resistor becomes low. In contrast, when the electrodes 3 are formed by the thermal spraying, the conductivity and adhesiveness to the sintered body 1 can be enhanced in the electrodes 3 using aluminum, copper, zinc, nickel, silver, or their alloy as the material of the electrodes 3. For this reason, the nonlinear resistor having such electrodes 3 can get the excellent discharge energy withstand.

(2-3) Average particle size of thermal spraying powder employed in forming the electrodes FIG. 6 is a graph showing a relationship between an average particle size (μm) of metal powders and the discharge energy withstand (J/cc) when the electrodes 3 of the nonlinear resistor are formed. More specifically, FIG. 6 shows results of the discharge energy withstand test of the nonlinear resistor in which the electrodes 3 are formed by changing the particle size of aluminum material in the plasma thermal spraying. In this case, the average particle size of the metal powders is a 50% particle size derived by the laser diffraction method.

As is apparent from results of the test shown in FIG.6, the nonlinear resistor, whose electrodes 3 are formed by using the metal powders an average particle size of which is ranging from 5 μm to 50 μm in the thermal spraying electrode, shows on an average the high discharge energy withstand in excess of 500 J/cc. In contrast, in the nonlinear resistor whose electrodes 3 are formed by using the metal powders an average particle size of which is smaller than 5 μm, or in the nonlinear resistor whose electrodes 3 are formed by using the metal powders the average particle size of which is larger than 50 μm, the discharge energy withstand is reduced.

More particularly, when the average particle size of the metal powders is smaller than 5 μm in forming the electrodes 3, the particle size of the metal powders in the nonlinear resistor being fabricated by using the metal powders is too small. Consequently, a great deal of powders are evaporated in plasma thermal spraying, so that areas in which the electrodes 3 are not formed on the thermal spraying electrode layers are partially produced. Accordingly, both the areas in which the electrodes 3 are formed and the areas in which the electrodes 3 are not formed are present together, so that the current distribution in the sintered body 1 as the nonlinear resistor becomes uneven. As a result, the discharge energy withstand is decreased.

Also, if the average particle size of the metal powders exceeds 50 μm in forming the electrodes 3, the particle size of the metal powders is too large in the nonlinear resistor being fabricated by using the metal powders. Thus, an amount of metal powders which are stuck onto the sintered body 1 as the nonlinear resistor as unmelted particles yet in the plasma thermal spraying is enhanced. For this reason, the number of voids is increased in the thermal spraying electrode, so that the discharge energy withstand is lowered. The results attained when aluminum is employed as the material of the electrodes 3 are depicted in FIG. 6, but the same effect of the particle size of the metal powders with respect to the discharge energy withstand can be recognized even if copper, zinc, nickel, silver, or their alloy is employed as the material of the electrodes 3.

In contrast, according to the nonlinear resistor having the electrodes 3 in which the average particle size of the metal powders is limited in the range of 5 μm to 50 μm, unevenness of the current distribution in the sintered body 1 due to lack in film thickness caused by evaporation can be prevented by preventing the evaporation of the metal powders in plasma thermal spraying, and at the same time the voids in the electrodes 3 can be reduced by reducing an amount of unmelted particles during the plasma thermal spraying and suppressing an amount of unmelted particles stuck onto the sintered body 1. Therefore, the above nonlinear resistor can achieve the high discharge energy withstand.

(2-4) Surface roughness of a sintered body on which the electrodes are formed

FIG. 7 is a graph showing a relationship between average surface roughness (μm) of the sintered body 1 and the discharge energy withstand (J/cc) when the electrodes 3 of the nonlinear resistor according to the second embodiment of the present invention is formed. More specifically, the electrodes 3 are formed after both end surfaces of the sintered body 1 have been polished when the nonlinear resistor is fabricated. FIG. 7 shows the results of the discharge energy withstand test of the nonlinear resistor in which the electrodes 3 are formed by changing the surface roughness of the sintered body 1, e.g., by changing the grain size of the polishing grinder, applying the blast process to the sintered body 1 by changing the grain size of the abrasive grains after the polishing, or the like.

As evident from results of the test shown in FIG. 7, the nonlinear resistor, in which the surface roughness of the sintered body 1 constituting the electrodes 3 of the nonlinear resistor is set in the range of 3 μm to 8 μm, exhibits on an average the high discharge energy withstand in excess of 500 J/cc. In contrast, in the nonlinear resistor, in which the average surface roughness of the sintered body 1 is smaller than 3 μm or larger than 8 μm, the discharge energy withstand becomes small.

In other words, since the nonlinear resistor being fabricated to reduce the average surface roughness of the sintered body 1 smaller than 3 μm in forming the electrodes 3 has a small surface area of the sintered body 1, adhesion strength between the sintered body 1 and the electrodes 3 is small and thus peel of the electrodes 3 is easily caused at end portions of the electrodes 3. Therefore, the discharge energy withstand becomes small. In the nonlinear resistor which is fabricated by setting the average surface roughness of the sintered body 1 larger than 8 μm in forming the electrodes 3, when the discharge energy is absorbed by the nonlinear resistor, the current distribution becomes uneven at the concave top ends on the surface of the sintered body 1. As a result, the discharge energy withstand is reduced.

In contrast, according to the nonlinear resistor in which the average surface roughness of the sintered body 1 is set in the range of 3 μm to 8 μm, a strong adhesion force between the sintered body 1 and the electrodes 3 can be assured. At the same time, unevenness of the current distribution at the concave top ends on the surface of the sintered body 1 can be prevented and thus the nonlinear resistor can have the excellent discharge energy withstand.

Based on the results of the above discharge energy withstand test, in the nonlinear resistor according to the second embodiment, the electrodes 3 are formed by using the plasma thermal spraying having the output of 10 kW or below and also any one of aluminum, copper, zinc, nickel, and silver or their alloy is employed as material of the electrodes 3. In addition, the average particle size of the metal powders as the material of the electrodes 3 is set in the range of 5 μm to 50 μm, and the upper surface 1*a* and the lower surface 1*b* of the sintered body 1 are set to have the average surface roughness in the range of 3 μm to 8 μm.

(3) Third embodiment

Subsequently, a third embodiment of the present invention will be explained with reference to FIGS. 8 to 12 hereunder. To begin with, several types of the nonlinear resistors are fabricated. Such nonlinear resistors have the electrodes 3 which have different characteristics by changing electrode forming conditions variously, but satisfying at least the condition for the electrodes 3 in the first embodiment, i.e., "the electrodes 3 are formed by the plasma thermal spraying in the atmosphere in which the oxygen concentration is set to less than or equal to 22 volume %" in the nonlinear resistor manufacturing steps set forth in the first embodiment.

More particularly, several types of the nonlinear resistors are fabricated under plural electrode forming conditions such as (3-1) porosity, (3-2) weight percentage of metal oxide, (3-3) average film thickness, (3-4) average surface roughness, and (3-5) resistivity. Then, while changing each objective condition as a parameter, the discharge energy withstand test is applied to several types of the nonlinear resistors respectively under the same discharge energy withstand test conditions as the above first embodiment. Plural electrode forming conditions being set actually to respective withstand conditions, and results of the discharge energy withstand test of several types of the nonlinear resistors which have the electrodes 3 formed under the plural electrode forming conditions will be explained separately in the following.

(3-1) Porosity

FIG. 8 is a graph showing a relationship between a porosity (%) of the electrode of the nonlinear resistor according to a third embodiment of the present invention and the discharge energy withstand (J/cc). More specifically, FIG.8 shows results of the discharge energy withstand test of the nonlinear resistors in which porosity in the thermal spraying electrode is varied by changing the conditions when the electrodes 3 are formed by the thermal spraying. In this case, after a test piece made of only the thermal spraying electrode has been picked up from the nonlinear resistor, the porosity is measured by executing a mercury injection test of the test piece.

As evident from results of the test shown in FIG. 8, the nonlinear resistor in which the porosity of the electrodes 3 is less than or equal to 15% shows on an average the high discharge energy withstand of more than 500 J/cc, while the discharge energy withstand is low in the nonlinear resistor in which the porosity of the electrodes 3 exceeds 15%. In other words, if the porosity of the electrodes 3 is in excess of 15%, the current distribution in the nonlinear resistor is made uneven by the pores on the interface between the sintered body 1 and the electrodes 3 of the nonlinear resistor when the nonlinear resistor absorbs the discharge energy, so that the discharge energy withstand is degraded.

On the contrary, if the porosity of the electrodes 3 is less than or equal to 15%, unevenness of the current distribution in the nonlinear resistor due to the pores on the interface between the sintered body 1 and the electrodes 3 of the nonlinear resistor can be prevented. Therefore, the excellent discharge energy withstand of the nonlinear resistor can be achieved. As described above, the nonlinear resistor having the excellent discharge energy withstand can be provided by suppressing the porosity of the electrodes 3 in the nonlinear resistor below or equal to 15%.

(3-2) Weight percentage of metal oxide

FIG. 9 is a graph showing a relationship between a weight percentage (%) of metal oxide in the electrode 3 of the nonlinear resistor according to the third embodiment of the present invention and the discharge energy withstand (J/cc). More specifically, FIG.9 shows results of the discharge energy withstand test of the nonlinear resistors in which the weight percentage of the metal oxide in the thermal spraying electrode is varied by changing the conditions when the electrodes 3 are formed by the thermal spraying. In this case, after a test piece made of only the thermal spraying electrode has been picked up from the nonlinear resistor, the weight percentage of the metal oxide is calculated by detecting an amount of oxygen in the test piece by using a burning method.

As evident from results of the test shown in FIG. 9, the nonlinear resistor in which the metal oxide in the electrodes 3 is less than or equal to 25 wt % shows on an average the high discharge energy withstand of more than 500 J/cc, while the discharge energy withstand is low in the nonlinear resistor in which the metal oxide in the electrodes 3 exceeds 25 w %. In other words, if the metal oxide in the electrodes 3 is in excess of 25 wt %, the current distribution in the nonlinear resistor is made uneven by the presence of the metal oxide on the interface between the sintered body 1 and the electrodes 3 of the nonlinear resistor when the nonlinear resistor absorbs the discharge energy, so that the discharge energy withstand is degraded.

On the contrary, if the metal oxide in the electrodes 3 is less than or equal to 25 wt %, unevenness of the current distribution in the nonlinear resistor due to the metal oxide on the interface between the sintered body 1 and the electrodes 3 of the nonlinear resistor can be prevented. Therefore, the excellent discharge energy withstand of the nonlinear resistor can be achieved. In this manner, the nonlinear resistor having the excellent discharge energy withstand can be provided by suppressing the metal oxide in the electrodes 3 in the nonlinear resistor below or equal to 25 wt %.

(3-3) Average film thickness

FIG. 10 is a graph showing a relationship between an average film thickness (μm) of the electrode of the nonlinear resistor according to the third embodiment of the present invention and the discharge energy withstand (J/cc). More specifically, FIG. 10 shows results of the discharge energy withstand test of the nonlinear resistors in which the average film thickness of the thermal spraying electrode is varied by changing the conditions when the electrodes 3 are formed by the thermal spraying. In this case, the average film thickness of the electrode is a mean film thickness which is detected from a film thickness in a microscopic photograph showing a sectional shape of the electrode 3.

As evident from results of the test shown in FIG. 10, the nonlinear resistor in which the average film thickness of the electrode 3 is set in the range of 5 μm to 500 μm shows on an average the high discharge energy withstand of more than 500 J/ cc, but the discharge energy withstand is low in the nonlinear resistor in which the average film thickness of the electrodes 3 is thinner than 5 μm or the average film thickness of the electrodes 3 is thicker than 500 μm.

In other words, in the nonlinear resistor in which the average film thickness of the electrodes 3 is thinner than 10 μm, a film thickness insufficient area and an adhesion defective area are readily formed in the electrodes 3. As a result, when the nonlinear resistor absorbs the discharge energy, the current distribution in the sintered body 1 in such areas becomes uneven and thus the discharge energy withstand is degraded. In addition, in the nonlinear resistor in which the average film thickness of the electrodes 3 is thicker than 100 μm, peel occurs easily between the sintered body 1 and the electrodes 3 of the nonlinear resistor. If such peel is caused between the sintered body 1 and the electrodes 3, the current distribution in the sintered body 1 of the nonlinear resistor becomes uneven in such peeled area when the nonlinear resistor absorbs the discharge energy, so that the discharge energy withstand is also degraded.

On the contrary, if the average film thickness of the electrodes 3 is set in the range of 5 μm to 500 μm, film thickness insufficiency and adhesion defect in the electrodes 3 of the nonlinear resistor can be prevented and also the peel caused between the sintered body 1 and the electrodes 3 by the increase in residual stress in the electrodes 3 can be prevented. Therefore, unevenness of the current distribution in the nonlinear resistor due to the above can be prevented, and the excellent discharge energy withstand of the nonlinear resistor can be achieved. As described above, according to the nonlinear resistor in which the average film thickness of the electrodes 3 is set in the range of 5 μm to 500 m, the excellent discharge energy withstand can be provided.

(3-4) Average surface roughness

FIG. 11 is a graph showing a relationship between average surface roughness (μm) of the electrode of the nonlinear resistor according to the third embodiment of the present invention and the discharge energy withstand (J/cc). More specifically, FIG. 11 shows results of the discharge energy withstand test of the nonlinear resistors in which the average surface roughness of the thermal spraying electrode is varied by changing the conditions when the electrodes 3 are formed by the thermal spraying.

As evident from results of the test shown in FIG. 11, the nonlinear resistor in which the average surface roughness of the electrodes 3 is less than or equal to 8 μm shows on an average the high discharge energy withstand of more than 500 J/cc, but the discharge energy withstand is reduced in the nonlinear resistor in which the average surface roughness of the electrodes 3 exceeds 8 μm. In other words, if the average surface roughness of the electrodes 3 is in excess of 8 μm, the discharge occurs easily in clearances between the stacked nonlinear resistors when the nonlinear resistor absorbs the discharge energy, so that the discharge energy withstand is degraded.

In contrast, if the average surface roughness of the electrodes 3 is less than or equal to 8 μm, the excellent discharge energy withstand of the nonlinear resistor can be achieved because the discharge caused in the clearances between the stacked nonlinear resistors can be prevented. That is to say, the nonlinear resistor having the excellent discharge energy withstand can be provided by suppressing the average surface roughness of the electrodes 3 in the nonlinear resistor below or equal to 8 μm.

(3-5) Resistivity

FIG. 12 is a graph showing a relationship between a resistivity (μΩ·cm) of the electrode of the nonlinear resistor according to the third embodiment of the present invention and the discharge energy withstand (J/cc). More specifically, FIG. 12 shows results of the discharge energy withstand test of the nonlinear resistors in which the resistivity of the thermal spraying electrode is varied by changing the conditions when the electrodes 3 are formed by the thermal spraying. In this case, after a test piece made of only the thermal spraying electrode has been picked up from the nonlinear resistor, a resistance value of the test piece is detected by a DC four terminal method and then the resistivity is calculated based on the resistance value and a shape of the test piece.

As evident from results of the test shown in FIG. 12, the nonlinear resistor in which the resistivity of the electrodes 3 is less than or equal to 15 μΩ·cm shows on an average the high discharge energy withstand of more than 500 J/cc, whereas the discharge energy withstand becomes low in the nonlinear resistor in which the resistivity of the electrodes 3 exceeds 15 μΩ·cm. This is because, if the resistivity of the electrodes 3 exceeds 15 μΩ·cm, i.e., if high resistance areas are present on the interface between the sintered body 1 and the electrodes 3 of the nonlinear resistor, the current distribution in the nonlinear resistor is made uneven by such high resistance areas formed between the sintered body 1 and the electrodes 3 of the nonlinear resistor when the nonlinear resistor absorbs the discharge energy.

On the contrary, if the resistivity of the electrodes 3 is less than or equal to 15 μΩ·cm, unevenness of the current distribution in the nonlinear resistor due to the high resistance areas formed on the interface between the sintered body 1 and the electrodes 3 of the nonlinear resistor can be prevented. Therefore, the excellent discharge energy withstand of the nonlinear resistor can be achieved. As described above, the nonlinear resistor having the excellent discharge energy withstand can be provided by suppressing the resistivity of the electrodes 3 in the nonlinear resistor below or equal to 15 μΩ·cm.

Based on the results of the above discharge energy withstand test, in the nonlinear resistor according to the third embodiment, the porosity of the electrodes 3 is set to less than or equal to 15% and also the weight percentage of the metal oxide in the electrodes 3 is set to less than or equal to 25%. Furthermore, the average film thickness of the electrodes 3 is set in the range of 5 μm to 500 μm, the average surface roughness is set to less than or equal to 8 μm, and the resistivity is set to less than or equal to 15 μΩ·cm.

(4) Fourth embodiment

A fourth embodiment of the present invention will be explained with reference to FIGS. 13 to 15 hereunder. To begin with, several types of the nonlinear resistors are fabricated. Such nonlinear resistors have the electrodes 3 which have different shapes by changing electrode forming conditions variously, but satisfying at least the condition for the electrodes 3 in the first embodiment, i.e., "the electrodes 3 are formed by the plasma thermal spraying in the atmosphere in which the oxygen concentration is set to less than or equal to 22 volume %" in the nonlinear resistor manufacturing steps set forth in the first embodiment.

In this case, in the fourth embodiment, the dimension of the electrodes 3 and uneven sizes at the end portions are changed variously by changing the method of forming the electrodes 3 and its conditions variously out of the above nonlinear resistor manufacturing steps, so that the nonlinear resistors having the electrodes 3 of different dimensions and shape can be fabricated.

FIG. 13 is a schematic view showing an electrode side end portion of the nonlinear resistor fabricated as above. In FIG. 13, a reference 17 denotes a sintered body side end portion; 18, an electrode; and 19, an electrode side end portion. In FIG. 13, a reference 21 denotes a distance between a parallel line 20 indicating an average position of the end portion along the diameter direction of the electrode 3 and the sintered body side end portion 17, i.e., an average distance between the electrode side end portion 19 and the sintered body side end portion 17. In FIG. 13, a reference 22 denotes a maximum value in variation of the unevenness of the electrode side end portion 19.

More particularly, several types of the nonlinear resistors are fabricated under plural electrode forming conditions such as (4-1) a distance between an electrode side end portion and a sintered body side end portion, and (4-2) a maximum value of unevenness of the electrode side end portion along the main surface direction. Then, while changing each objective condition as a parameter, the discharge energy withstand test is applied to several types of the nonlinear resistors respectively under the same discharge energy withstand test conditions as the above first embodiment. Plural electrode forming conditions being set actually to respective withstand conditions, and results of the discharge energy withstand test of several types of the nonlinear resistors which have the electrodes 3 formed under the plural electrode forming conditions will be explained separately in the following.

(4-1) Distance between an electrode side end portion and a sintered body side end portion FIG. 14 is a graph showing a relationship between a distance (mm) 21 between the electrode side end portion 19 and the sintered body side end portion 17 of the nonlinear resistor according to the fourth embodiment of the present invention and the discharge energy withstand (J/cc). More specifically, FIG. 14 shows results of the discharge energy withstand test of the nonlinear resistors in which the shape of the thermal spraying electrode is varied by changing the conditions when the electrodes 3 are formed by the thermal spraying.

As evident from results of the test shown in FIG. 14, the nonlinear resistor in which the distance 21 between the electrode side end portion 19 and the sintered body side end portion 17 is set in the range of 0.01 mm to 1.0 mm shows on an average the high discharge energy withstand of more than 500 J/cc, whereas the discharge energy withstand becomes low in the nonlinear resistor in which the distance 21 between the electrode side end portion 19 and the sintered body side end portion 17 is shorter than 0.01 mm or the distance 21 between the electrode side end portion 19 and the sintered body side end portion 17 is longer than 1.0 mm.

In other words, if the distance 21 between the electrode side end portion 19 and the sintered body side end portion 17 of the nonlinear resistor is shorter than 0.01 mm, dielectric breakdown is ready to occur on the interface between the sintered body 1 and a side surface insulating layer of the nonlinear resistor, or in the side surface insulating layer, or on the side surfaces of the side surface insulating layer when the nonlinear resistor absorbs the discharge energy. As a result, the discharge energy withstand of the nonlinear resistor is degraded. In addition, if the distance 21 between the electrode side end portion 19 and the sintered body side end portion 17 of the nonlinear resistor is longer than 1.0 mm, the discharge energy withstand of the nonlinear resistor is also degraded since the current distribution in the sintered body 1 of the nonlinear resistor becomes uneven when the nonlinear resistor absorbs the discharge energy.

On the contrary, if the distance 21 between the electrode side end portion 19 and the sintered body side end portion 17 of the nonlinear resistor is set in the range of 0.01 mm to 1.0 mm, the dielectric breakdown being caused on the interface between the sintered body 1 and the side surface insulating layer, or in the side surface insulating layer, or on the side surfaces of the side surface insulating layer when the nonlinear resistor absorbs the discharge energy, or unevenness of the current distribution in the nonlinear resistor can be prevented. Therefore, the excellent discharge energy withstand of the nonlinear resistor can be achieved. As described above, the nonlinear resistor having the excellent discharge energy withstand can be provided by setting the distance 21 between the electrode side end portion 19 and the sintered body side end portion 17 of the nonlinear resistor in the range of 0.01 mm to 1.0 mm.

(4-2) Maximum value of unevenness of an electrode side end portion

FIG. 15 is a graph showing a relationship between a maximum value 22 (±mm) of unevenness of the electrode side end portion 19 of the nonlinear resistor according to the fourth embodiment of the present invention and the discharge energy withstand (J/cc) of the nonlinear resistor. More specifically, FIG. 15 shows results of the discharge energy withstand test of the nonlinear resistors in which the shape of the thermal spraying electrode is varied by changing the conditions when the electrodes 3 are formed by the thermal spraying.

As evident from results of the test shown in FIG. 15, the nonlinear resistor in which the maximum value 22 of unevenness of the electrode side end portion 19 is set in a range of ±0.5 mm shows on an average the high discharge energy withstand of more than 500 J/cc, while the discharge energy withstand is low in the nonlinear resistor in which the maximum value 22 in variation of the unevenness of the electrode side end portion 19 is set outside of the range of ±0.5 mm.

In other words, if the maximum value 22 in variation of the unevenness of the electrode side end portion 19 of the nonlinear resistor is set outside of the range of ±0.5 mm, the current distribution in the sintered body 1 of the nonlinear resistor is made uneven at the convex top end of the electrode side end portion 19 of the nonlinear resistor when the nonlinear resistor absorbs the discharge energy, so that the discharge energy withstand of the nonlinear resistor is degraded.

On the other hand, if the maximum value 22 in variation of the unevenness of the electrode side end portion 19 of the nonlinear resistor is set in the range of ±0.5 mm, the excellent discharge energy withstand of the nonlinear resistor can be achieved since unevenness of the current distribution in the nonlinear resistor due to the convex top end of the electrode side end portion 19 can be prevented. In this manner, the nonlinear resistor having the excellent discharge energy withstand can be provided by suppressing the maximum value 22 in variation of the unevenness of the electrode side end portion 19 of the nonlinear resistor within the range of ±0.5 mm.

Based on the results of the above discharge energy withstand test, in the nonlinear resistor according to the fourth embodiment, the distance 21 between the electrode side end portion 19 and the sintered body side end portion 17 of the nonlinear resistor is set in the range of 0.01 mm to 1.0 mm, and also the maximum value 22 in variation of the unevenness of the electrode side end portion 19 of the nonlinear resistor is set within the range of ±0.5 mm.

As described above, according to the present invention, unevenness of the current distribution caused in the sintered body in absorbing the discharge energy can be prevented by limiting the electrode forming conditions by using the plasma thermal spraying and the material or shape of the electrode. As a result, the nonlinear resistor having the excellent discharge withstand can be provided.

What is claimed is:

1. A nonlinear resistor comprising:

a sintered body including a zinc oxide as a main component, said sintered body having an upper surface, a lower surface, and a side surface;

an insulating layer formed on the side surface of the sintered body; and a pair of electrodes formed on the upper surface and the lower surface of the sintered body, respectively, by a plasma spraying, wherein the electrode is formed by the plasma spraying in an atmosphere in which an oxygen concentration is set to less than or equal to 22% by volume, wherein the electrode is formed by the plasma spraying of which an output is set to less than or equal to 10 kW, wherein a discharge energy withstand of the nonlinear resistor is at least 500 J/cc, wherein the electrode has a porosity of less than or equal to 15%.

2. A nonlinear resistor according to claim 1, wherein the electrode is formed of any one of aluminum, copper, zinc, nickel, and silver or their alloy.

3. A nonlinear resistor according to claim 1, wherein the electrode is formed by a metal powder, and an average particle size of the metal powder is set in a range of 5 $\mu$m to 50 $\mu$m.

4. A nonlinear resistor according to claim 1, wherein the upper surface and the lower surface of the sintered body have an average surface roughness within a range of 3 $\mu$m to 8 $\mu$m.

5. A nonlinear resistor according to claim 1, wherein the electrode contains a metal oxide and a metal, and a weight percentage of the metal oxide contained in the electrode is set to less than or equal to 25%.

6. A nonlinear resistor according to claim 1, wherein the electrode has an average thickness in a range of 5 $\mu$m to 500 $\mu$m.

7. A nonlinear resistor according to claim 1, wherein the electrode has an average surface roughness of less than or equal to 8 $\mu$m.

8. A nonlinear resistor according to claim 1, wherein the electrode has a resistivity of less than or equal to 15 $\mu\Omega\cdot$cm.

9. A nonlinear resistor according to claim 1, wherein the electrode has a side end portion and the sintered body has a side end portion, and a distance between the side end portion of the electrode and the side end portion of the sintered body is set in a range of 0.01 mm to 1.0 mm.

10. A nonlinear resistor according to claim 1, wherein the electrode has a side end portion which has an unevenness in a direction parallel with the upper surface or the lower surface of the sintered body, a variation of the unevenness is set in a range of ±0.5 mm.

* * * * *